United States Patent
Dykaar

(10) Patent No.: US 10,505,338 B2
(45) Date of Patent: Dec. 10, 2019

(54) SYSTEMS, DEVICES, AND METHODS FOR NARROW WAVEBAND LASER DIODES

(71) Applicant: NORTH INC., Kitchener (CA)

(72) Inventor: Douglas R. Dykaar, Waterloo (CA)

(73) Assignee: North Inc., Kitchener, ON (CA)

( * ) Notice: Subject to any disclaimer, the term of this patent is extended or adjusted under 35 U.S.C. 154(b) by 0 days.

(21) Appl. No.: 16/046,443

(22) Filed: Jul. 26, 2018

(65) Prior Publication Data

US 2019/0033596 A1 Jan. 31, 2019

Related U.S. Application Data

(60) Provisional application No. 62/537,344, filed on Jul. 26, 2017.

(51) Int. Cl.
| | |
|---|---|
| *H01S 5/00* | (2006.01) |
| *H01S 5/028* | (2006.01) |
| *H04N 9/31* | (2006.01) |
| *G02B 27/01* | (2006.01) |
| *H01S 5/40* | (2006.01) |

(52) U.S. Cl.
CPC .......... *H01S 5/0078* (2013.01); *H01S 5/0285* (2013.01); *H01S 5/0287* (2013.01); *G02B 2027/015* (2013.01); *G02B 2027/0116* (2013.01); *G02B 2027/0174* (2013.01); *G02B 2027/0178* (2013.01); *H01S 5/0071* (2013.01); *H01S 5/4012* (2013.01); *H01S 5/4093* (2013.01); *H04N 9/3129* (2013.01); *H04N 9/3161* (2013.01)

(58) Field of Classification Search
CPC .... H01S 5/0287; H01S 5/0071; H01S 5/4012; H01S 5/4093; H01S 5/0078; H01S 5/0285

See application file for complete search history.

(56) References Cited

U.S. PATENT DOCUMENTS

| | | | |
|---|---|---|---|
| 10,038,301 B1 * | 7/2018 | Eggleston | H01S 5/0657 |
| 2005/0105084 A1 * | 5/2005 | Wang | G01J 3/02 356/301 |
| 2008/0101426 A1 * | 5/2008 | Komatsu | H01S 5/141 372/28 |
| 2008/0298406 A1 * | 12/2008 | Day | B82Y 20/00 372/39 |
| 2016/0372893 A1 * | 12/2016 | McLaurin | H01L 24/95 |
| 2017/0074640 A1 * | 3/2017 | Cable | G01B 9/02083 |

* cited by examiner

*Primary Examiner* — Kinam Park
(74) *Attorney, Agent, or Firm* — Thomas Mahon

(57) ABSTRACT

Systems, devices, and methods for narrow waveband laser diodes are described. The conventional coating on the output facet of a laser diode is replaced with a notch filter coating that is reflective of wavelengths within a narrow waveband around the nominal output wavelength of the laser diode and transmissive of other wavelengths. The notch filter coating ensures the laser diode will lase at the nominal wavelength and not lase for wavelengths outside of the narrow waveband. The notch-filtered laser diode provides a narrow waveband output that is matched to the playback wavelength of at least one hologram in a transparent combiner of a wearable heads-up display, and thereby reduces or eliminates display aberrations that can result from wavelength sensitivity of the playback properties of the hologram.

12 Claims, 5 Drawing Sheets

SYSTEMS, DEVICES, AND METHODS FOR NARROW WAVEBAND LASER DIODES

TECHNICAL FIELD

The present systems, devices, and methods generally relate to laser diodes having a narrow output waveband and particularly relate to wearable heads-up displays that employ laser diodes having a narrow output waveband.

BACKGROUND

Description of the Related Art

Wearable Heads-UP Displays

A head-mounted display is an electronic device that is worn on a user's head and, when so worn, secures at least one electronic display within a viewable field of at least one of the user's eyes, regardless of the position or orientation of the user's head. A wearable heads-up display is a head-mounted display that enables the user to see displayed content but also does not prevent the user from being able to see their external environment. The "display" component of a wearable heads-up display is either transparent or at a periphery of the user's field of view so that it does not completely block the user from being able to see their external environment. Examples of wearable heads-up displays include: the Google Glass®, the Optinvent Ora®, the Epson Moverio®, and the Sony Glasstron®, just to name a few.

The optical performance of a wearable heads-up display is an important factor in its design. When it comes to face-worn devices, however, users also care a lot about aesthetics. This is clearly highlighted by the immensity of the eyeglass (including sunglass) frame industry. Independent of their performance limitations, many of the aforementioned examples of wearable heads-up displays have struggled to find traction in consumer markets because, at least in part, they lack fashion appeal. Most wearable heads-up displays presented to date employ large display components and, as a result, most wearable heads-up displays presented to date are considerably bulkier and less stylish than conventional eyeglass frames.

A challenge in the design of wearable heads-up displays is to minimize the bulk of the face-worn apparatus will still providing displayed content with sufficient visual quality. There is a need in the art for wearable heads-up displays of more aesthetically-appealing design that are capable of providing high-quality images to the user without limiting the user's ability to see their external environment.

BRIEF SUMMARY

A laser diode may be summarized as including: a layer of p-type semiconductor material; a layer of n-type semiconductor material; a layer of optically active material disposed between the layer of p-type semiconductor material and the layer of n-type semiconductor material; a reflective rear facet at a first end of the layer of optically active material; a partially reflective output facet at a second end of the layer of optically active material, the second end opposite the first end across a length of the layer of optically active material to define a laser cavity at least partially bounded by the layer of p-type semiconductor material, the layer of n-type semiconductor material, the reflective rear facet, and the partially reflective output facet; and at least one notch filter coating applied to at least one of the reflective rear facet and the partially reflective output facet. The at least one notch filter coating may be at least partially reflective of light within a narrow waveband and substantially transmissive of light outside of the narrow waveband.

The at least one notch filter coating may have a first reflectivity for light that is within the narrow waveband and a second reflectivity for light that is outside of the narrow waveband. The first reflectivity for light that is within the narrow waveband may be at least twice the second reflectivity for light that is outside of the narrow waveband. The first reflectivity for light that is within the narrow waveband may be greater than 70% and the second reflectivity for light that is outside of the narrow waveband may be less than 30%.

The narrow waveband may have a bandwidth of less than 10 nm. The narrow waveband may be centered on a nominal output wavelength of the laser diode. The narrow waveband may include a gain peak of the laser diode.

The at least one notch filter coating may include a rugate device.

The at least one notch filter coating may be applied to the reflective rear facet and not to the partially reflective output facet. The at least one notch filter coating may be applied to the partially reflective output facet and not to the reflective rear facet. The at least one notch filter coating may be applied to both the reflective rear facet and the partially reflective output facet; that is, the at least one notch filter may include a first notch filter coating applied to the partially reflective output facet and a second notch filter coating applied to the reflective rear facet.

A wearable heads-up display may be summarized as including: a support structure that in use is worn on a head of a user of the wearable heads-up display; a transparent combiner carried by the support structure and positioned in a field of view of an eye of the user when the support structure is worn on the head of the user, wherein the transparent combiner includes at least one holographic optical element; and a laser projector carried by the support structure and positioned and oriented to project laser light onto the at least one holographic optical element, wherein the laser projector includes at least one laser diode and the at least one laser diode comprises: a layer of p-type semiconductor material; a layer of n-type semiconductor material; a layer of optically active material disposed between the layer of p-type semiconductor material and the layer of n-type semiconductor material; a reflective rear facet at a first end of the layer of optically active material; a partially reflective output facet at a second end of the layer of optically active material, the second end opposite the first end across a length of the layer of optically active material to define a laser cavity at least partially bounded by the layer of p-type semiconductor material, the layer of n-type semiconductor material, the reflective rear facet, and the partially reflective output facet; and at least one notch filter coating applied to at least one of the reflective rear facet and the partially reflective output facet. The at least one notch filter coating may be at least partially reflective of light within a narrow waveband and substantially transmissive of light outside of the narrow waveband.

The at least one notch filter coating may have a first reflectivity for light that is within the narrow waveband and a second reflectivity for light that is outside of the narrow waveband. The first reflectivity for light that is within the narrow waveband may be at least twice the second reflectivity for light that is outside of the narrow waveband. The first reflectivity for light that is within the narrow waveband may be greater than 70% and the second reflectivity for light that is outside of the narrow waveband may be less than 30%.

The narrow waveband may have a bandwidth of less than 10 nm. The narrow waveband may be centered on a nominal output wavelength of the laser diode. The narrow waveband may include a gain peak of the laser diode. The holographic optical element may include at least one hologram that is responsive to light within the narrow waveband.

The at least one notch filter coating may include a rugate device.

The at least one notch filter coating may be applied to the reflective rear facet and not to the partially reflective output facet. The at least one notch filter coating may be applied to the partially reflective output facet and not to the reflective rear facet. The at least one notch filter coating may be applied to both the reflective rear facet and the partially reflective output facet; that is, the at least one notch filter may include a first notch filter coating applied to the partially reflective output facet and a second notch filter coating applied to the reflective rear facet.

A method of fabricating a narrow waveband laser diode may be summarized as including: forming a laser cavity; positioning a first facet at a first end of the laser cavity; coating a second facet with a notch filter coating; and positioning the second facet, with the notch filter coating applied thereto, at a second end of the laser cavity, the second end opposite the first end across a length of the laser cavity.

Positioning a first facet at a first end of the laser cavity may include positioning a reflective rear facet at the first end of the laser cavity. Coating a second facet with a notch filter coating may include coating a partially reflective output facet with the notch filter coating. Positioning the second facet, with the notch filter coating applied thereto, at a second end of the laser cavity may include positioning the partially reflective output facet, with the notch filter coating applied thereto, at the second end of the laser cavity. In some implementations, the method may further include coating the reflective rear facet with the notch filter coating prior to positioning the reflective rear facet at the first end of the laser cavity.

Alternatively, positioning a first facet at a first end of the laser cavity may include positioning a partially reflective output facet at the first end of the laser cavity. Coating a second facet with a notch filter coating may include coating a reflective rear facet with the notch filter coating. Positioning the second facet, with the notch filter coating applied thereto, at a second end of the laser cavity may include positioning the reflective rear facet, with the notch filter coating applied thereto, at the second end of the laser cavity.

Forming a laser cavity may include forming a laser cavity comprising a layer of p-type semiconductor material, a layer of n-type semiconductor material, and a layer of optically active material disposed between the layer of p-type semiconductor material and the layer of n-type semiconductor material.

Coating a second facet with a notch filter coating may include coating the second facet with a notch filter coating that is at least partially reflective of light within a narrow waveband and substantially transmissive of light outside of the narrow waveband. Coating the second facet with a notch filter coating that is at least partially reflective of light within a narrow waveband and substantially transmissive of light outside of the narrow waveband may include coating the second facet with a notch filter coating that has a first reflectivity for light that is within the narrow waveband and a second reflectivity for light that is outside of the narrow waveband, wherein the first reflectivity for light that is within the narrow waveband is at least twice the second reflectivity for light that is outside of the narrow waveband. Coating the second facet with a notch filter coating that has a first reflectivity for light that is within the narrow waveband and a second reflectivity for light that is outside of the narrow waveband may include coating the second facet with a notch filter coating that has a first reflectivity greater than 70% for light that is within the narrow waveband and a second reflectivity less than 30% for light that is outside of the narrow waveband.

Coating the second facet with a notch filter coating that is at least partially reflective of light within a narrow waveband and substantially transmissive of light outside of the narrow waveband may include coating the second facet with a notch filter coating that is at least partially reflective of light within a narrow waveband of less than 10 nm and substantially transmissive of light outside of the narrow waveband of less than 10 nm.

Coating the second facet with a notch filter coating that is at least partially reflective of light within a narrow waveband and substantially transmissive of light outside of the narrow waveband may include coating the second facet with a notch filter coating that is at least partially reflective of light within a narrow waveband centered on a nominal output wavelength of the laser diode and substantially transmissive of light outside of the narrow waveband centered on the nominal output wavelength of the laser diode.

Coating the second facet with a notch filter coating that is at least partially reflective of light within a narrow waveband and substantially transmissive of light outside of the narrow waveband may include coating the second facet with a notch filter coating that is at least partially reflective of light within a narrow waveband that includes a gain peak of the laser diode and substantially transmissive of light outside of the narrow waveband that includes the gain peak of the laser diode.

Coating a second facet with a notch filter coating may include coating the second facet with a rugate device.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn are not necessarily intended to convey any information regarding the actual shape of the particular elements, and have been solely selected for ease of recognition in the drawings.

DETAILED DESCRIPTION

Figure 1:
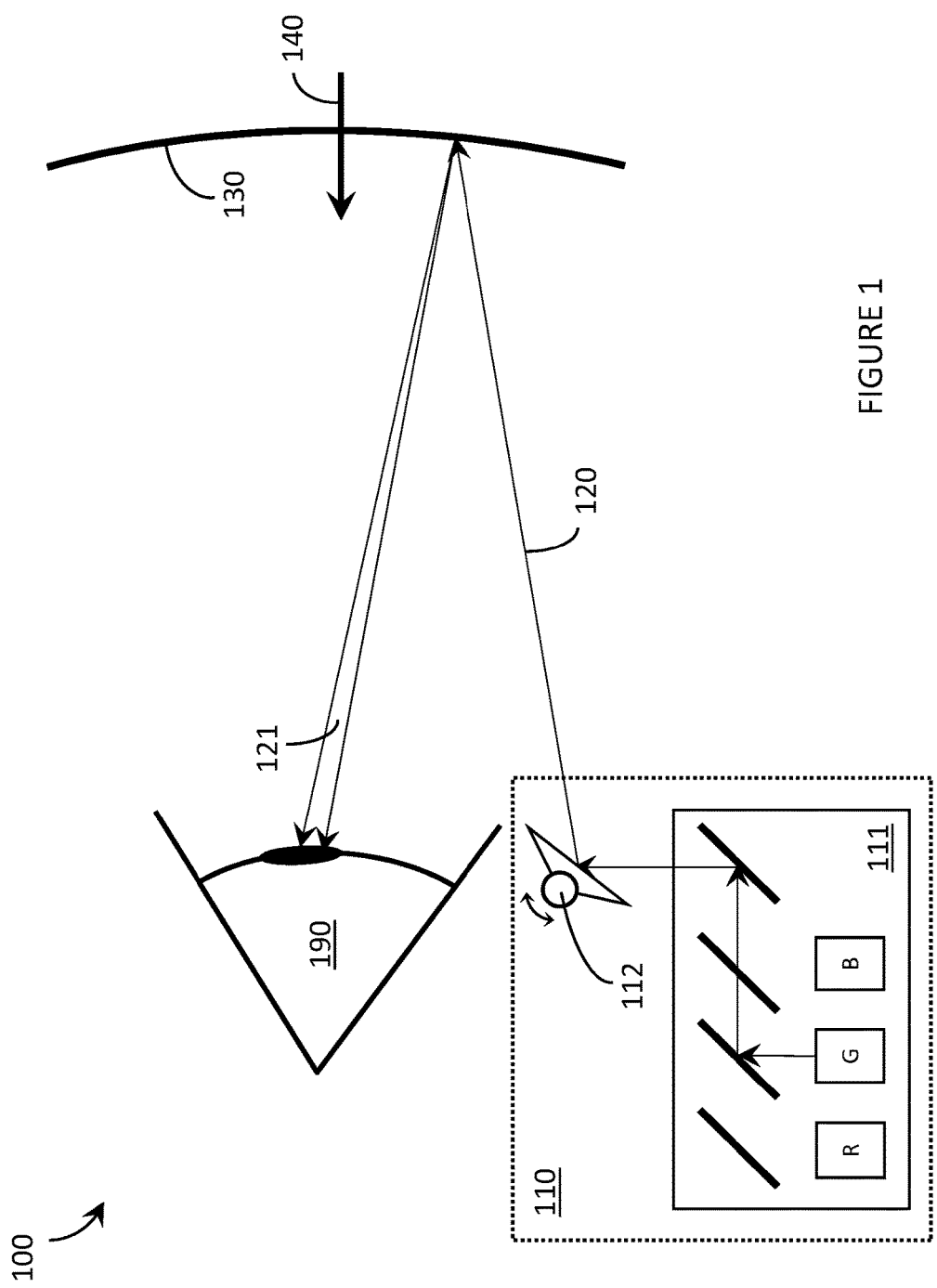
FIG. 1 is an illustrative diagram showing a side view of a wearable heads-up display that employs a scanning laser projector.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with portable electronic devices and head-worn devices, have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

The headings and Abstract of the Disclosure provided herein are for convenience only and do not interpret the scope or meaning of the embodiments.

The various embodiments described herein provide systems, devices, and methods for laser diodes with narrow waveband outputs. Such is conventionally achieved in the art by coupling the output of a laser diode into an external component, such as a volume Bragg grating, that resides outside of and apart from the laser diode itself. While appropriate for some applications, external components such as volume Bragg gratings are expensive and can add considerable volume and bulk to a laser diode, which is particularly disadvantageous in applications for which compact laser diodes are desired.

An example of an application for which compact laser diodes are desired is in a wearable heads-up display ("WHUD") that employs one or more laser diode(s) as a light source for generating display images. For example, the present systems, devices, and methods are well-suited for use in WHUDs that employ a scanning laser projector ("SLP") including at least one laser diode. Examples of such displays are described in U.S. Provisional Patent Application Ser. No. 62/017,089; U.S. Provisional Patent Application Ser. No. 62/053,598; U.S. Provisional Patent Application Ser. No. 62/117,316; U.S. Provisional Patent Application Ser. No. 62/134,347 (now U.S. Non-Provisional patent application Ser. No. 15/070,887); U.S. Provisional Patent Application Ser. No. 62/156,736; U.S. Provisional Patent Application Ser. No. 62/242,844; US Patent Publication No. US 2015-0378164 A1; US Patent Publication No. US 2015-0378161 A1; US Patent Publication No. US 2015-0378162 A1; U.S. Non-Provisional patent application Ser. No. 15/145,576; U.S. Non-Provisional patent application Ser. No. 15/145,609; U.S. Non-Provisional patent application Ser. No. 15/145,583; U.S. Non-Provisional patent application Ser. No. 15/046,234; U.S. Non-Provisional patent application Ser. No. 15/046,254; and U.S. Non-Provisional patent application Ser. No. 15/046,269. A generalized example of such a WHUD architecture is provided in FIG. 1.

FIG. 1 is an illustrative diagram showing a side view of a WHUD 100 that employs a SLP 110. SLP 110 comprises a laser module 111 that includes a red laser diode (labelled "R" in FIG. 1), a green laser diode (labelled "G" in FIG. 1), and a blue laser diode (labelled "B" in FIG. 1), and a scan mirror 112 that is controllably rotatable about two axes of freedom. A single scan mirror 112 that is rotatable about two axes of freedom is used only as an illustrative example herein and a person of skill in the art will appreciate that similar functionality may be realized using a different mirror configuration, such as for example two scan mirrors that are each controllably rotatable about a respective one of two orthogonal axes of freedom and respectively positioned in sequence with respect to the optical path of laser light 120. Laser light 120 output by SLP 110 may comprise any modulated combination of red laser light (output by the red laser diode), green laser light (output by the green laser diode), and/or blue laser light (output by the blue laser diode). For ease of illustration, laser light 120 in FIG. 1 is shown comprising only green laser light.

Laser light 120 reflected from scan mirror 112 is, in the illustrated exemplary implementation of a WHUD shown in FIG. 1, incident on a holographic optical element ("HOE") 130 that redirects laser light 120 back towards an eye 190 of a user. Generally, in the present systems, devices, and methods, the term "user" refers to a user of a laser diode. In the specific context of FIG. 1, the term "user" refers to a person wearing or using WHUD 100. A person of skill in the art will appreciate that WHUD 100 may include a support frame and/or other support/alignment structure(s) (not depicted in FIG. 1 to reduce clutter) that enable a user to wear the elements depicted in FIG. 1 so that at least HOE 130 is positioned within a field of view of at least one eye 190 of the user when WHUD 100 is worn on a head of the user. A person of skill in the art will also appreciate that alternative WHUD architectures that employ laser diodes and HOEs may similarly be employed, such as for example an architecture in which HOE 130 is carried by an optical waveguide or lightguide and, for example, serves as a holographic in-coupler or out-coupler therefor.

HOE 130 may be substantially optically transparent to environmental light 140 (i.e., optically transparent to the majority of wavelengths that make up environmental light 140) incident from the opposite side of HOE 130 relative to laser light 120. Because HOE 130 effectively combines projected laser light 120 and external environmental light 140 in the user's field of view, HOE 130 may be referred to as a "combiner" or related variant, such as "transparent combiner," "holographic optical combiner," or similar (or as a component of such a combiner). If the support frame (not illustrated) of WHUD 100 has the general shape, appearance, and/or geometry of a pair of eyeglasses, then HOE 130 may be carried on one or more transparent lens(es) of WHUD 100 (such as one or more prescription lenses or one or more non-prescription lenses). Further details on the composition of HOE 130 (e.g., including exemplary multiplexed configurations of HOE 130) and on ways in which HOE 130 may redirect laser light 120 towards eye 190 (e.g., including exemplary exit pupil and eyebox configurations) are described in at least the patent applications listed above.

The playback properties of a holographic optical element (e.g., a hologram) can be particularly sensitive to a number of factors, including properties of the light that is incident thereon. For example, the playback properties of HOE 130 are particularly sensitive to the angle and wavelength of incident laser light 120. In FIG. 1, incident laser light 120 is shown having a single angle of incidence on HOE 130 but reflecting over a small range 121 of angles of reflection. This is because even though laser light 120 only comprises "green" laser light in the illustrated example of FIG. 1, the green laser diode (labelled G in FIG. 1) that outputs green laser light 120 does so over a certain waveband comprising multiple green wavelengths. The sensitivity of HOE 130 to incident wavelength is such that the bandwidth of green laser light 120 output by the green laser diode in projector 110 produces a range 121 of reflection angles at HOE 130, even for a fixed incidence angle. This small range 121 of reflection angles is undesirable in WHUD 100 because it adversely affects display quality. For example, in the illustration of FIG. 1, a single green dot is being displayed to the user and even though SLP 110 is projecting the green dot to a single location in the user's field of view the dot may appear to "wobble" over range 121 of reflection angles in correspondence with the bandwidth of green laser light output by the green laser diode. The present systems, devices, and methods provide laser diodes having narrow output wavebands that are particularly well-suited to reducing the range 121 of reflection angles corresponding to each incidence point on HOE 130 and thereby reducing (ideally eliminating) this "wobble" effect.

Figure 2:
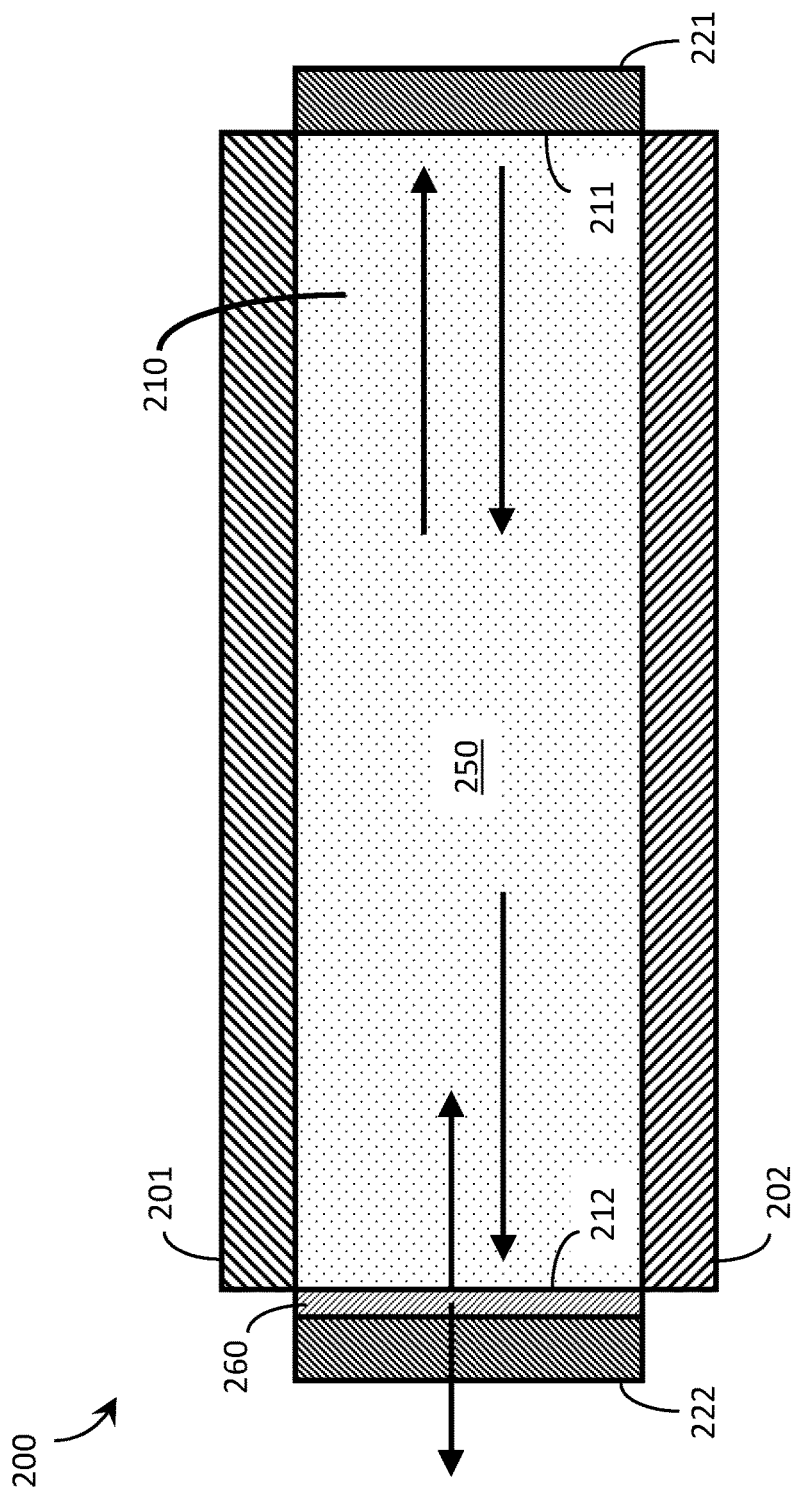
FIG. 2 is a sectional view of a laser diode having a narrow output waveband in accordance with the present systems, devices, and methods.

FIG. 2 is a sectional view of a laser diode 200 having a narrow output waveband in accordance with the present systems, devices, and methods. Laser diode 200 comprises: a layer of p-type semiconductor material 201, a layer of n-type semiconductor material 202, a layer of optically active material 210 disposed between layer of p-type semiconductor material 201 and layer of n-type semiconductor material 202, a reflective rear facet 221 at a first end 211 of layer of optically active material 210; a partially reflective output facet 222 at a second end 212 of layer of optically active material 210, second end 212 opposite first end 211 across a length of layer of optically active material 210 to define a laser cavity 250 at least partially bounded by layer of p-type semiconductor material 201, layer of n-type semiconductor material 202, reflective rear facet 221, and partially reflective output facet 222, and at least one notch filter coating 260 applied to at least one of reflective rear facet 221 and partially reflective output facet 222. In the illustrated example of FIG. 2, only a single notch filter coating 260 is applied to partially reflective output facet 222 and no notch filter coating is applied to reflective rear facet 221; however, in alternative implementations multiple notch filter coating 260 may be applied to partially reflective output facet 222, and/or at least one additional notch filter coating may be applied to reflective rear facet 221 such that both partially reflective output facet 222 and reflective rear facet 221 have at least one respective notch filter coating 260 applied thereto, and/or notch filter coating 260 may not be applied to partially reflective output facet 222 at all and instead at least one notch filter coating may be applied only to reflective rear facet 221.

Notch filter coating 260 may, for example, employ common coating oxides such as SiO2, TiO2, Al2O3, And/or Ta2O5, and/or common coating fluorides such as MgF2, LaF3, and/or AlF3. Notch filter coating 260 may, for example, employ similar materials to Bragg reflector coatings, except that the design wavelength may be shifted such that out-of-band oscillations overlap the lasing region of the laser spectrum. For example, notch filter coating 260 may employ alternating layers of dielectric and metallic materials, such as tantalum pentoxide and/or aluminum oxide. There are many material compositions that may achieve a desired notch filter coating. In general, notch filter coating 260 is at least partially reflective of light within a narrow waveband and substantially transmissive (i.e., about 80% transmissive) of light outside of the narrow waveband. Generally, notch filter coating 260 has a first reflectivity for light that is within the narrow waveband and a second reflectivity for light that is outside of the narrow waveband. In some implementations, the first reflectivity for light that is within the narrow waveband may be at least twice the second reflectivity for light that is outside of the narrow waveband. As an example, the first reflectivity for light that is within the narrow waveband may be greater than about 70% and the second reflectivity for light that is outside of the narrow waveband may be less than about 30%.

Laser diode 200 includes an optical notch filter 260 integrated with the output facet 222 and thereby achieves a narrow waveband output without the need for outcoupling into an expensive and bulky external cavity, such as a volume Bragg grating. Notch filter 260 comprises a coating applied directly to output facet 222, where the coating is designed to be reflective of light in a certain narrow waveband (i.e., the desired output waveband of laser diode 200) and transmissive of light outside of that narrow waveband. Notch filter coating 260 may be applied to either or both surfaces of output facet 222 and may comprise a grating structure, such as for example a rugate device. Since coatings are typically applied to laser facets anyway, the application of notch filter coating 260 need not add considerable cost to laser diode 200 relative to other laser diodes, and notch filter coating 260 is generally less expensive than an external cavity with volume Bragg grating. In some implementations, notch filter 260 may include a film where "coating" output facet 222 with notch filter 260 includes adhering or otherwise affixing notch filter 260 to a surface of output facet 222.

In general, a laser diode may "lase" based on gain and loss as a function wavelength. The laser may lase wherever (in wavelength) the gain exceeds the loss. Notch filter coating 260 may be transmissive (i.e., lossy) for all wavelengths except those within one narrow waveband; thus notch filter coating 260 may "keep in" light that is in the narrow waveband and force laser diode 200 to lase within the narrow waveband. This may be true even if facet 221 is still highly reflective over a broadband, and even if notch filter coating 260 has a partial reflectivity of about 80%.

While the gain-bandwidth of the lasing medium (210) can be broad, once lasing starts at a given wavelength, the available gain typically goes (mostly) into that lasing mode. However, gain competition can result when the selectivity between adjacent modes is so small that small perturbations can cause mode hops. Notch filter coating 260 may prevent mode hops by having higher loss outside the narrow waveband and thereby preventing lasing for wavelengths outside of the narrow waveband. Generally, the physics is substantially similar to that of other external cavity designs in common usage, such as volume Bragg gratings.

As described previously, in some implementations, notch filter coating 260 may be applied to rear facet 221 instead of output facet 222, though in general it may be more straightforward to fabricate a partially reflective notch filter (i.e., an output facet 222 with a notch filter coating 260) than a fully reflective notch filter (i.e., a rear facet 221 with a notch filter coating such as notch filter coating 260).

As described previously, in some implementations, a respective notch filter coating such as coating 260 (e.g., a first notch filter coating and a second notch filter coating, respectively) may be applied to both output facet 222 and rear facet 221, but in such implementations the notch characteristics of both facets may need to be matched which can add unwanted complexity and cost to the laser diode construction.

The narrow waveband output by laser diode 200 may not be as narrow as can be achieved by an external cavity with volume Bragg grating, but still may generally be less than about 10 nm and at considerably less cost with considerably less volume added to the laser diode. The narrow waveband of notch filter coating 260 may be centered on a nominal output wavelength of laser diode 200 and may include a gain peak of laser diode 200.

As previously described, notch filter coating 260 may include a custom coating applied to output facet 222 and may, in some implementations, include a rugate device to achieve the desired notch filtering properties.

Figure 3:
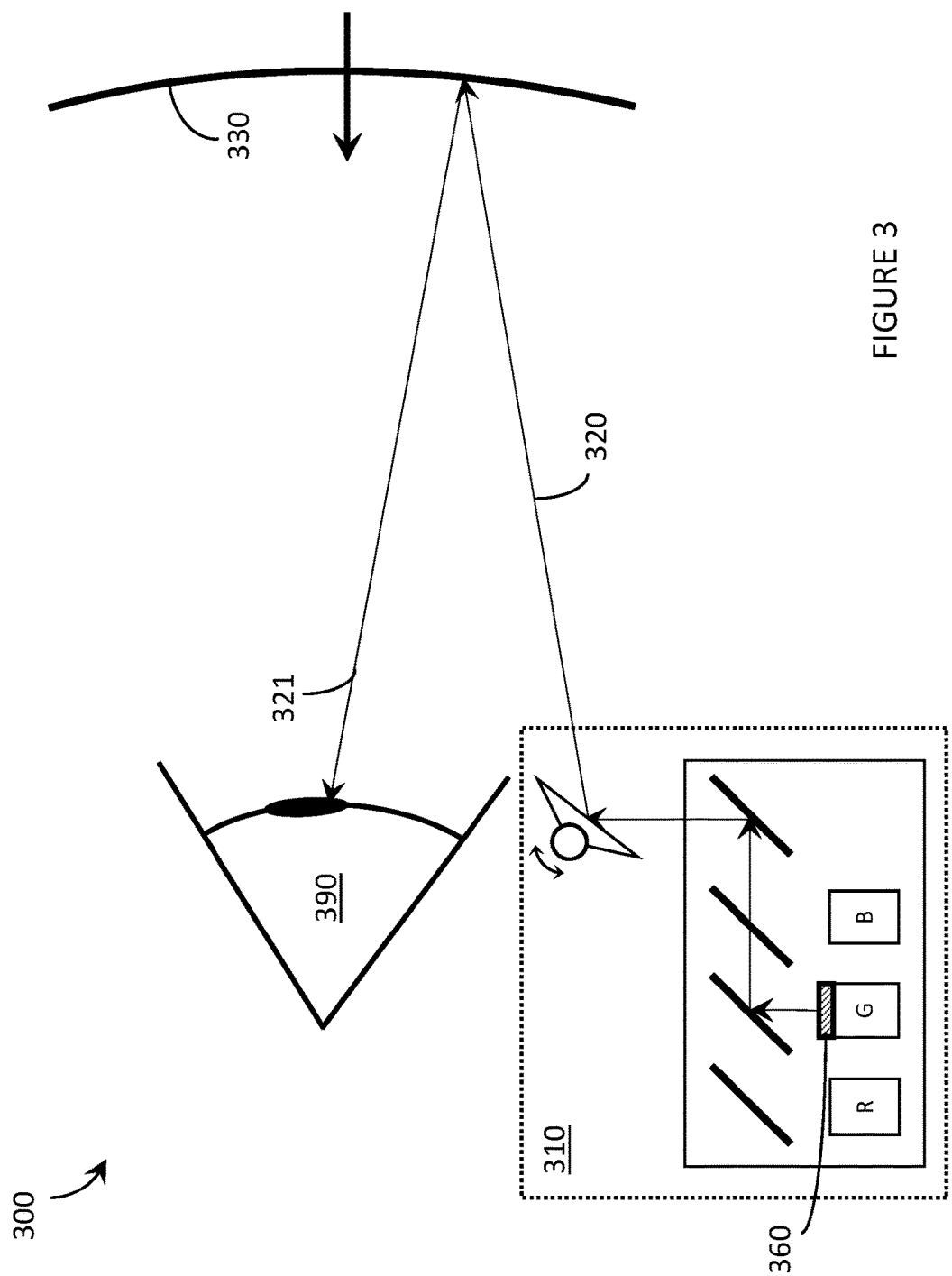
FIG. 3 is an illustrative diagram showing a side view of a wearable heads-up display that employs a scanning laser projector having at least a green laser diode with a notch filter coating in accordance with the present systems, devices, and methods.

FIG. 3 is an illustrative diagram showing a side view of a WHUD 300 that employs a SLP 310 having at least a green laser diode (labeled "G" in FIG. 3) with a notch filter coating 360 in accordance with the present systems, devices, and methods. WHUD 300 is substantially similar to WHUD 100 with the exception that the green laser diode of WHUD 100 had no notch filter coating whereas the green laser diode of WHUD 300 is substantially similar to laser diode 200 of FIG. 2 and does have at least one notch filter coating 360 applied.

In FIG. 3, SLP 310 is projecting green laser light 320 to the same fixed location on HOE 330 as SLP 110 was projecting green laser light 120 onto HOE 130 in FIG. 1; however, because the green laser diode in FIG. 3 has notch filter coating 360 applied at the output facet thereof (see FIG. 2), green laser light 320 of FIG. 3 is of a much narrower waveband (e.g., bandwidth of less than about 10 nm, or less than about 5 nm, or less than about 3 nm) compared to green laser light 120 of FIG. 1 and, as a result, reflected light 321 is reflected to a point on eye 390 rather than over a range 121 of reflection angles as was the case in FIG. 1. In other words, notch filter coating 360 narrows the waveband of green laser light 320 relative to green laser light 120 and thereby reduces (or ideally eliminates as drawn in FIG. 3) the "wobble" effect caused by the playback sensitivity of HOE 130/330 to the wavelength of light incident thereon. In this case, the "green dot" displayed to eye 390 of the user of WHUD 300 will not appear to wobble as does the "green dot" displayed to eye 190 of the user of WHUD 100, or at least, will appear to wobble to a lesser extent. Such improves the overall display quality of WHUD 300 relative to that of WHUD 100.

Figure 4:
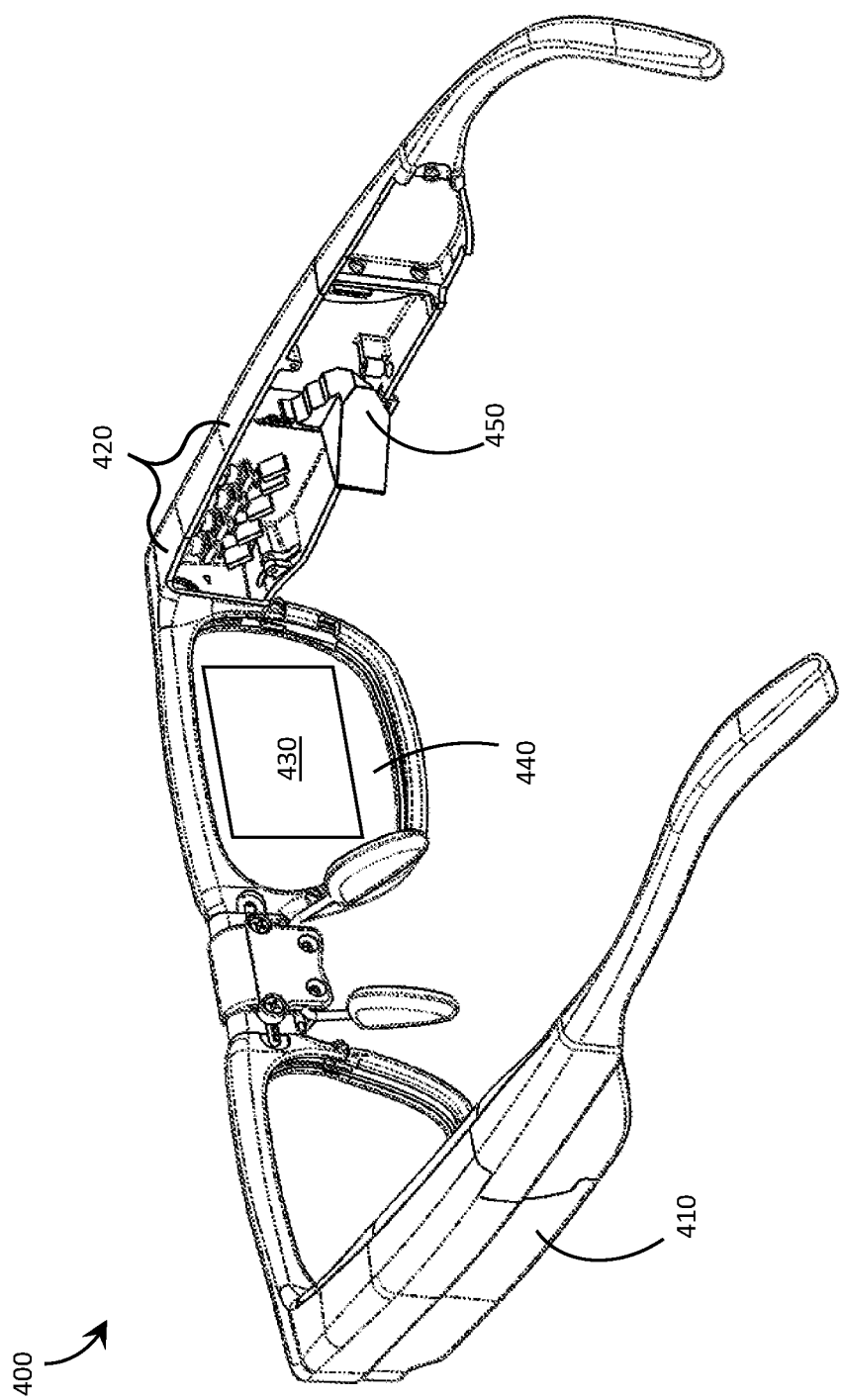
FIG. 4 is a partial-cutaway perspective view of a wearable heads-up display that employs laser diodes with notch filter coating applied thereto (e.g., to the output facets thereof) to provide narrow waveband laser light and reduce display aberrations in accordance with the present systems, devices, and methods.

FIG. 4 is a partial-cutaway perspective view of a WHUD 400 that employs laser diodes with notch filter coating applied thereto (e.g., to the output facets thereof) to provide narrow waveband laser light and reduce display aberrations in accordance with the present systems, devices, and methods. WHUD 400 includes a support structure 410 that in use is worn on the head of a user and has a general shape and appearance of an eyeglasses (e.g., sunglasses) frame. Support structure 410 carries multiple components, including: a SLP 420, a transparent (holographic) combiner 430, and an eyebox expansion optic 450. Portions of SLP 420 and eyebox expansion optic 450 may be contained within an inner volume of support structure 410; however, FIG. 4 provides a partial-cutaway view in which regions of support structure 410 have been removed in order to render visible portions of SLP 420 and eyebox expansion optic 450 that may otherwise be concealed.

Throughout this specification and the appended claims, the term "carries" and variants such as "carried by" are generally used to refer to a physical coupling between two objects. The physical coupling may be direct physical coupling (i.e., with direct physical contact between the two objects) or indirect physical coupling that may be mediated by one or more additional objects. Thus, the term carries and variants such as "carried by" are meant to generally encompass all manner of direct and indirect physical coupling, including without limitation: carried on, carried within, physically coupled to, and/or supported by, with or without any number of intermediary physical objects therebetween.

SLP 420 may include multiple laser diodes (e.g., a red laser diode, a green laser diode, and/or a blue laser diode) and at least one scan mirror (e.g., a single two-dimensional scan mirror or two one-dimensional scan mirrors, which may be, e.g., MEMS-based or piezo-based). SLP 420 may be communicatively coupled to (and support structure 410 may further carry) a processor and a non-transitory processor-readable storage medium or memory storing processor-executable data and/or instructions that, when executed by the processor, cause the processor to control the operation of SLP 420. For ease of illustration, FIG. 4 does not call out a processor or a memory.

Transparent (holographic) combiner 430 is positioned within a field of view of at least one eye of the user when support structure 410 is worn on the head of the user. Holographic combiner 430 is sufficiently optically transparent to permit light from the user's environment (i.e., "environmental light") to pass through to the user's eye. In the illustrated example of FIG. 4, support structure 410 further carries a transparent eyeglass lens 440 (e.g., a prescription eyeglass lens or a non-prescription lens) and holographic combiner 430 comprises at least one layer of holographic material that is adhered to, affixed to, laminated with, carried in or upon, or otherwise integrated with eyeglass lens 440. The at least one layer of holographic material may include a photopolymer film such as Bayfol® HX available from Bayer MaterialScience AG or a silver halide compound and may, for example, be integrated with transparent lens 440 using any of the techniques described in U.S. Provisional Patent Application Ser. No. 62/214,600. Holographic combiner 430 includes at least one hologram in or on the at least one layer of holographic material. With holographic combiner 430 positioned in a field of view of an eye of the user when support structure 410 is worn on the head of the user, the at least one hologram of holographic combiner 430 is positioned and oriented to redirect light originating from SLP 420 towards the eye of the user. In particular, the at least one hologram is positioned and oriented to receive light signals that originate from SLP 420 and converge those light signals to at least one exit pupil at or proximate the eye of the user. As described previously, in some implementations holographic combiner 430 may include an optical waveguide or lightguide through which laser light from SLP 420 is propagated, and the at least one hologram of holographic combiner 430 may be carried by such optical waveguide or lightguide and provide the functionality of a holographic in-coupler or out-coupler.

One or more of the laser diode(s) in SLP 420 is/are substantially similar to laser diode 200 from FIG. 2 and include(s) a notch filter coating applied to the output facet thereof for the purpose of narrowing the waveband of laser light emitted thereby. This notch filter coating is relatively inexpensive and takes up virtually no extra space in SLP 420 (since the laser diodes will typically have some form of coating applied to their output facets anyway), but has considerable benefit in reducing display aberrations by ensuring more consistent and reliable playback of laser light from holographic combiner 430. This benefit is achieved by matching the narrow waveband output of the one or more laser diode(s) to the playback wavelength(s) of the one or more hologram(s) in holographic combiner 430. In other words, holographic combiner 430 includes at least one hologram that is responsive to light within the narrow waveband of at least one laser diode, such narrow waveband provided by a notch filter coating applied to the output facet of the at least one laser diode.

Figure 5:
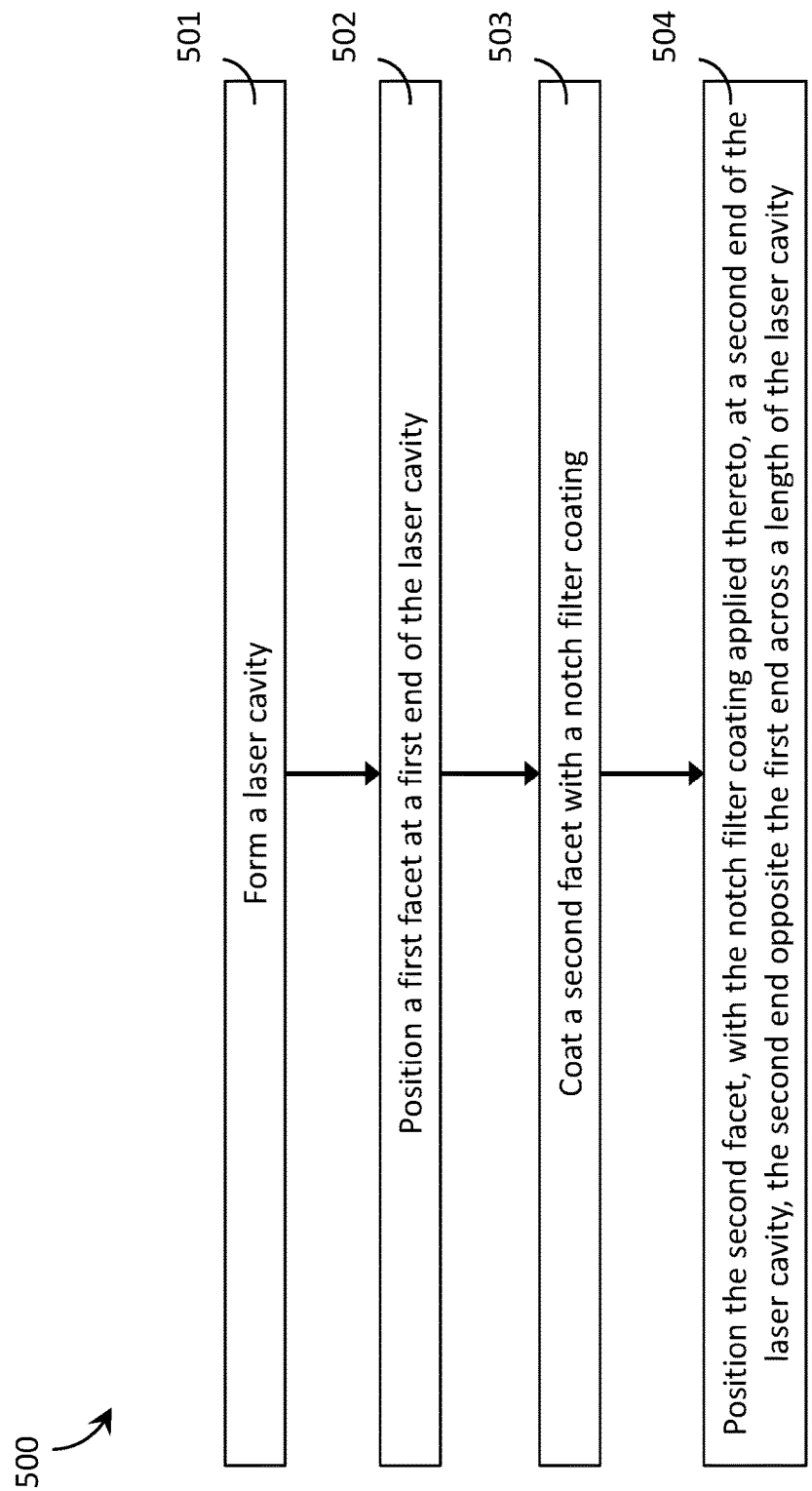
FIG. 5 is a flow-diagram showing a method of fabricating a narrow waveband laser diode in accordance with the present systems, devices, and methods.

FIG. 5 is a flow-diagram showing a method 500 of fabricating a narrow waveband laser diode in accordance with the present systems, devices, and methods. The narrow waveband laser diode may be substantially similar to laser diode 200 from FIG. 2 and generally includes a notch filter coating applied to a partially reflective output facet. Method 500 includes four acts 501, 502, 503, and 504, though those of skill in the art will appreciate that in alternative embodiments certain acts may be omitted and/or additional acts may be added. Those of skill in the art will also appreciate that the illustrated order of the acts is shown for exemplary purposes only and may change in alternative embodiments.

At 501, a laser cavity is formed. The laser cavity may be substantially similar to laser cavity 250 from FIG. 2 and forming the laser cavity may include forming a laser cavity comprising a layer of p-type semiconductor material, a layer of n-type semiconductor material, and a layer of optically active material disposed between the layer of p-type semiconductor material and the layer of n-type semiconductor material. For example, forming the laser cavity may include forming a layer of n-type semiconductor material (e.g., on a substrate), forming a layer of optically active material on the layer of n-type semiconductor material, and forming a layer of p-type semiconductor material on top of the layer of optically active material to dispose the layer of optically active material in between the layer of n-type semiconductor material and the layer of p-type semiconductor material. In alternative implementations, forming the laser cavity may include forming a layer of p-type semiconductor material (e.g., on a substrate), forming a layer of optically active material on the layer of p-type semiconductor material, and forming a layer of n-type semiconductor material on top of the layer of optically active material to dispose the layer of optically active material in between the layer of n-type semiconductor material and the layer of p-type semiconductor material.

At 502, a first facet is positioned at a first end of the laser cavity. The first facet may be a reflective rear facet positioned at a rear or back end of the laser cavity or the first facet may be a partially reflective output facet positioned at a front or output end of the laser cavity.

At 503, a second facet is coated with a notch filter coating. The coating may, for example, comprise thin layers of dielectric and/or metallic materials (e.g., oxides, fluorides, etc., as described previously) applied by deposition (e.g., atomic layer deposition, chemical vapor deposition) processes or other known coating processes, such as thermal and electron beam evaporation or sputtering (e.g., magnetron sputtering, ion beam sputtering, or similar), depending on the thicknesses required.

As described previously, coating a facet with a "notch filter" coating may include coating the facet with a coating that is at least partially reflective of light within a narrow waveband (e.g., less than about 10 nm) that: i) is centered on a nominal output wavelength of the laser diode; and/or ii) includes a gain peak of the laser diode, and substantially transmissive of light outside of such narrow waveband. The coating may have a first reflectivity (e.g., about 70% or more) for light that is within the narrow waveband and a second reflectivity (e.g., about 30% or less) for light that is outside of the narrow waveband. In some implementations, coating the second facet with a notch filter coating at 503 may include coating the second facet with a rugate device.

At 504, the second facet, with the notch filter coating applied thereto, is positioned at a second end of the laser cavity, the second end opposite the first end across a length of the laser cavity.

In method 500, either one of the "first facet" and the "second facet" may be a reflective rear facet (e.g., 221 in FIG. 2) of the laser diode and the other one of the "second facet" and the first "facet" may be a partially reflective output facet (e.g., 222 in FIG. 2) of the laser diode. Similarly, either one of the "first end" and the "second end" of the laser cavity may correspond to the rear end of the laser diode and the other one of the "second end" and the "first end" may correspond to the output end of the laser diode. That is, in some implementations: positioning a first facet at a first end of the laser cavity at 502 includes positioning a reflective rear facet at the first end of the laser cavity; coating a second facet with a notch filter coating at 503 includes coating a partially reflective output facet with the notch filter coating; and positioning the second facet, with the notch filter coating applied thereto, at a second end of the laser cavity at 504 includes positioning the partially reflective output facet, with the notch filter coating applied thereto, at the second end of the laser cavity. In such implementations, method 500 may be extended to further include coating the reflective rear facet with the notch filter coating prior to positioning the reflective rear facet at the first end of the laser cavity, such that both the partially reflective output facet and the reflective rear facet are coated with respective notch filter coatings prior to being positioned at respective ends of the laser cavity. However, in alternative implementations: positioning a first facet at a first end of the laser cavity at 502 includes positioning a partially reflective output facet at the first end of the laser cavity; coating a second facet with a notch filter coating at 503 includes coating a reflective rear facet with the notch filter coating; and positioning the second facet, with the notch filter coating applied thereto, at a second end of the laser cavity at 504 includes positioning the reflective rear facet, with the notch filter coating applied thereto, at the second end of the laser cavity.

Throughout this specification and the appended claims, the term "about" is sometimes used in relation to specific values or quantities. For example, "light within a bandwidth of about 10 nm or less." Unless the specific context requires otherwise, the term about generally means±15%.

The WHUDs described herein may include one or more sensor(s) (e.g., microphone, camera, thermometer, compass, and/or others) for collecting data from the user's environment. For example, one or more camera(s) may be used to provide feedback to the processor of the wearable heads-up display and influence where on the transparent display(s) any given image should be displayed.

The WHUDs described herein may include one or more on-board power sources (e.g., one or more battery(ies)), a wireless transceiver for sending/receiving wireless communications, and/or a tethered connector port for coupling to a computer and/or charging the one or more on-board power source(s).

Throughout this specification and the appended claims the term "communicative" as in "communicative pathway," "communicative coupling," and in variants such as "communicatively coupled," is generally used to refer to any engineered arrangement for transferring and/or exchanging information. Exemplary communicative pathways include, but are not limited to, electrically conductive pathways (e.g., electrically conductive wires, electrically conductive traces), magnetic pathways (e.g., magnetic media), and/or optical pathways (e.g., optical fiber), and exemplary communicative couplings include, but are not limited to, electrical couplings, magnetic couplings, and/or optical couplings.

Throughout this specification and the appended claims, infinitive verb forms are often used. Examples include, without limitation: "to detect," "to provide," "to transmit," "to communicate," "to process," "to route," and the like. Unless the specific context requires otherwise, such infinitive verb forms are used in an open, inclusive sense, that is as "to, at least, detect," to, at least, provide," "to, at least, transmit," and so on.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other portable and/or wearable electronic devices, not necessarily the exemplary wearable electronic devices generally described above.

For instance, the foregoing detailed description has set forth various embodiments of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one embodiment, the present subject matter may be implemented via Application Specific Integrated Circuits (ASICs). However, those skilled in the art will recognize that the embodiments disclosed herein, in whole or in part, can be equivalently implemented in standard integrated circuits, as one or more computer programs executed by one or more computers (e.g., as one or more programs running on one or more computer systems), as one or more programs executed by on one or more controllers (e.g., microcontrollers) as one or more programs executed by one or more processors (e.g., microprocessors, central processing units, graphical processing units), as firmware, or as virtually any combination thereof, and that designing the circuitry and/or writing the code for the software and or firmware would be well within the skill of one of ordinary skill in the art in light of the teachings of this disclosure.

When logic is implemented as software and stored in memory, logic or information can be stored on any processor-readable medium for use by or in connection with any processor-related system or method. In the context of this disclosure, a memory is a processor-readable medium that is an electronic, magnetic, optical, or other physical device or means that contains or stores a computer and/or processor program. Logic and/or the information can be embodied in any processor-readable medium for use by or in connection with an instruction execution system, apparatus, or device, such as a computer-based system, processor-containing system, or other system that can fetch the instructions from the instruction execution system, apparatus, or device and execute the instructions associated with logic and/or information.

In the context of this specification, a "non-transitory processor-readable medium" can be any element that can store the program associated with logic and/or information for use by or in connection with the instruction execution system, apparatus, and/or device. The processor-readable medium can be, for example, but is not limited to, an electronic, magnetic, optical, electromagnetic, infrared, or semiconductor system, apparatus or device. More specific examples (a non-exhaustive list) of the computer readable medium would include the following: a portable computer diskette (magnetic, compact flash card, secure digital, or the like), a random access memory (RAM), a read-only memory (ROM), an erasable programmable read-only memory (EPROM, EEPROM, or Flash memory), a portable compact disc read-only memory (CDROM), digital tape, and other non-transitory media.

The various embodiments described above can be combined to provide further embodiments. To the extent that they are not inconsistent with the specific teachings and definitions herein, all of the U.S. patents, U.S. patent application publications, U.S. patent applications, foreign patents, foreign patent applications and non-patent publications referred to in this specification and/or listed in the Application Data Sheet which are owned by Thalmic Labs Inc., including but not limited to: U.S. Provisional Patent Application Ser. No. 62/537,344; U.S. Provisional Patent Application Ser. No. 62/017,089; U.S. Provisional Patent Application Ser. No. 62/053,598; U.S. Provisional Patent Application Ser. No. 62/117,316; U.S. Provisional Patent Application Ser. No. 62/134,347 (now U.S. Non-Provisional patent application Ser. No. 15/070,887); U.S. Provisional Patent Application Ser. No. 62/156,736; U.S. Provisional Patent Application Ser. No. 62/242,844; US Patent Publication No. US 2015-0378164 A1; US Patent Publication No. US 2015-0378161 A1; US Patent Publication No. US 2015-0378162 A1; U.S. Non-Provisional patent application Ser. No. 15/145,576; U.S. Non-Provisional patent application Ser. No. 15/145,609; U.S. Non-Provisional patent application Ser. No. 15/145,583; U.S. Non-Provisional patent application Ser. No. 15/046,234; U.S. Non-Provisional patent application Ser. No. 15/046,254; and U.S. Non-Provisional patent application Ser. No. 15/046,269, are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of fabricating a narrow waveband laser diode, the method comprising:

forming a laser cavity;

positioning a first facet at a first end of the laser cavity;
coating a second facet with a notch filter coating; and
positioning the second facet, with the notch filter coating applied thereto, at a second end of the laser cavity, the second end opposite the first end across a length of the laser cavity.

2. The method of claim 1 wherein:
positioning a first facet at a first end of the laser cavity includes positioning a reflective rear facet at the first end of the laser cavity;
coating a second facet with a notch filter coating includes coating a partially reflective output facet with the notch filter coating; and
positioning the second facet, with the notch filter coating applied thereto, at a second end of the laser cavity includes positioning the partially reflective output facet, with the notch filter coating applied thereto, at the second end of the laser cavity.

3. The method of claim 2, further comprising:
coating the reflective rear facet with the notch filter coating prior to positioning the reflective rear facet at the first end of the laser cavity.

4. The method of claim 1 wherein:
positioning a first facet at a first end of the laser cavity includes positioning a partially reflective output facet at the first end of the laser cavity;
coating a second facet with a notch filter coating includes coating a reflective rear facet with the notch filter coating; and
positioning the second facet, with the notch filter coating applied thereto, at a second end of the laser cavity includes positioning the reflective rear facet, with the notch filter coating applied thereto, at the second end of the laser cavity.

5. The method of claim 1 wherein forming a laser cavity includes forming a laser cavity comprising a layer of p-type semiconductor material, a layer of n-type semiconductor material, and a layer of optically active material disposed between the layer of p-type semiconductor material and the layer of n-type semiconductor material.

6. The method of claim 1 wherein coating a second facet with a notch filter coating includes coating the second facet with a notch filter coating that is at least partially reflective of light within a narrow waveband and substantially transmissive of light outside of the narrow waveband.

7. The method of claim 6 wherein coating the second facet with a notch filter coating that is at least partially reflective of light within a narrow waveband and substantially transmissive of light outside of the narrow waveband incudes coating the second facet with a notch filter coating that has a first reflectivity for light that is within the narrow waveband and a second reflectivity for light that is outside of the narrow waveband, and wherein the first reflectivity for light that is within the narrow waveband is at least twice the second reflectivity for light that is outside of the narrow waveband.

8. The method of claim 7 wherein coating the second facet with a notch filter coating that has a first reflectivity for light that is within the narrow waveband and a second reflectivity for light that is outside of the narrow waveband includes coating the second facet with a notch filter coating that has a first reflectivity greater than 70% for light that is within the narrow waveband and a second reflectivity less than 30% for light that is outside of the narrow waveband.

9. The method of claim 6 wherein coating the second facet with a notch filter coating that is at least partially reflective of light within a narrow waveband and substantially transmissive of light outside of the narrow waveband includes coating the second facet with a notch filter coating that is at least partially reflective of light within a narrow waveband of less than 10 nm and substantially transmissive of light outside of the narrow waveband of less than 10 nm.

10. The method of claim 6 wherein coating the second facet with a notch filter coating that is at least partially reflective of light within a narrow waveband and substantially transmissive of light outside of the narrow waveband includes coating the second facet with a notch filter coating that is at least partially reflective of light within a narrow waveband centered on a nominal output wavelength of the laser diode and substantially transmissive of light outside of the narrow waveband centered on the nominal output wavelength of the laser diode.

11. The method of claim 6 wherein coating the second facet with a notch filter coating that is at least partially reflective of light within a narrow waveband and substantially transmissive of light outside of the narrow waveband includes coating the second facet with a notch filter coating that is at least partially reflective of light within a narrow waveband that includes a gain peak of the laser diode and substantially transmissive of light outside of the narrow waveband that includes the gain peak of the laser diode.

12. The method of claim 1 wherein coating a second facet with a notch filter coating includes coating the second facet with a rugate device.

\* \* \* \* \*